United States Patent [19]

Lang

[11] Patent Number: 4,897,769

[45] Date of Patent: Jan. 30, 1990

[54] RIGHT ANGLE LIGHT EMITTING DIODE ASSEMBLY WITH SNAP-IN FEATURE

[75] Inventor: John M. Lang, Redondo Beach, Calif.

[73] Assignee: Xerox Corporation, Stamford, Conn.

[21] Appl. No.: 197,186

[22] Filed: May 18, 1988

[51] Int. Cl.4 .................................... H01R 33/00
[52] U.S. Cl. ............................ 362/226; 362/396; 362/800
[58] Field of Search ............... 362/226, 368, 396, 800

[56] References Cited

U.S. PATENT DOCUMENTS

| | | | |
|---|---|---|---|
| 2,542,144 | 2/1951 | Kearns | 85/40 |
| 2,922,978 | 1/1960 | Engel | 339/17 |
| 3,273,104 | 9/1966 | Krol | 339/128 |
| 3,596,233 | 7/1971 | DeVito | 339/128 |
| 4,195,330 | 3/1980 | Savage, Jr. | 362/226 |
| 4,419,722 | 12/1983 | Bury | 362/396 |
| 4,471,415 | 9/1984 | Larson et al. | 362/800 |
| 4,507,718 | 3/1985 | Bury | 362/396 |
| 4,575,785 | 3/1986 | Lerude et al. | 362/226 |
| 4,580,859 | 4/1986 | Frano et al. | 339/91 R |
| 4,667,277 | 5/1987 | Hanchar | 362/250 |

*Primary Examiner*—Stephen F. Husar
*Attorney, Agent, or Firm*—Robert E. Cumha

[57] ABSTRACT

This invention relates to a right angle light emitting diode assembly with snap-in feature wherein an insulating body, generally in the shape of a rectangular parallelepiped, no larger than a finger nail, holds a light emitting diode in the insulating body at right angles to the surface of a printed wiring board, the insulating body being shaped such that robotic equipment can be used to insert the diode assembly cheaply and efficiently onto said board. The insulating body has front and back generally parallel surfaces, top and bottom generally parallel surfaces, and first and second generally parallel side surfaces, the respective surfaces having grooves and protuberances to allow the light emitting diode (LED) to be fixedly mounted in said body and the body to be inserted into a printed wiring board which can then be wave soldered without deleterious effects on the LED or supporting body. The bottom of the body has two oppositely faced snap-in proturbances which pass through the hole on a printed wiring board which deform inwardly slightly while passing through the hole and expand outwardly after extending out from beyond the hole to fixedly mount the diode assembly in the correct position on the board.

4 Claims, 2 Drawing Sheets

RIGHT ANGLE LIGHT EMITTING DIODE ASSEMBLY WITH SNAP-IN FEATURE

This invention relates to a right angle light emitting diode assembly with the ability to be snapped into place on a printed wiring board by hand or by using robotic equipment. The light emitting diode can be robotically inserted into its plastic housing and the housing itself then robotically mounted onto the printed wiring board and held in place prior to soldering of the printed wiring board by the use of snap-in projections. After solder flowing, the right angle LED assembly is more fixedly mounted to the board.

BACKGROUND OF THE INVENTION

The art of circuit mounting is full of prior art disclosures and reductions to practice. Many of the prior art devices are a snap-in feature whereby the component is inserted into a printed wiring board hole and, by means of resilient plastic or the equivalent projections, the housing is snapped into place. The prior art is void, however, of a light emitting diode holder that can be assembled by robotic means and also installed on a printed wiring board by robotic means. The use of robots in manufacturing is a rapidly growing industry manufacturing technique because of equipment reliability and saving in the expense of human installers. While the prior art is full of insertion type patents, none disclose the use of a right angle light emitting diode assembly that can be installed on a printed wiring board and then processed by wave soldering apparatus to fixedly mount the component to the board, at the same time providing the necessary electrical connections to the board's printed wiring circuitry.

According to the present invention, a right angle light emitting diode assembly with snap-in feature is disclosed wherein an insulating body, generally in the shape of a rectangular parallelepiped, no larger than a finger nail, holds a light emitting diode in the insulating body at right angles to the surface of a printed wiring board, the insulating body being shaped such that robotic equipment can be used to insert the diode assembly cheaply and efficiently onto said board. The insulating body has front and back generally parallel surfaces, top and bottom generally parallel surfaces, and first and second generally parallel side surfaces, the respective surfaces having grooves and protuberances to allow the light emitting diode (LED) to be fixedly mounted in said body and the body to be inserted into a printed wiring board which can then be wave soldered without deleterious effects on the LED or supporting body. The bottom of the body has two oppositely faced snap-in protuberances which pass through the hole on a printed wiring board which deform inwardly slightly while passing through the hole and expand outwardly after extending out from beyond the hole to fixedly mount the diode assembly in the correct position on the board.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Figure 1:
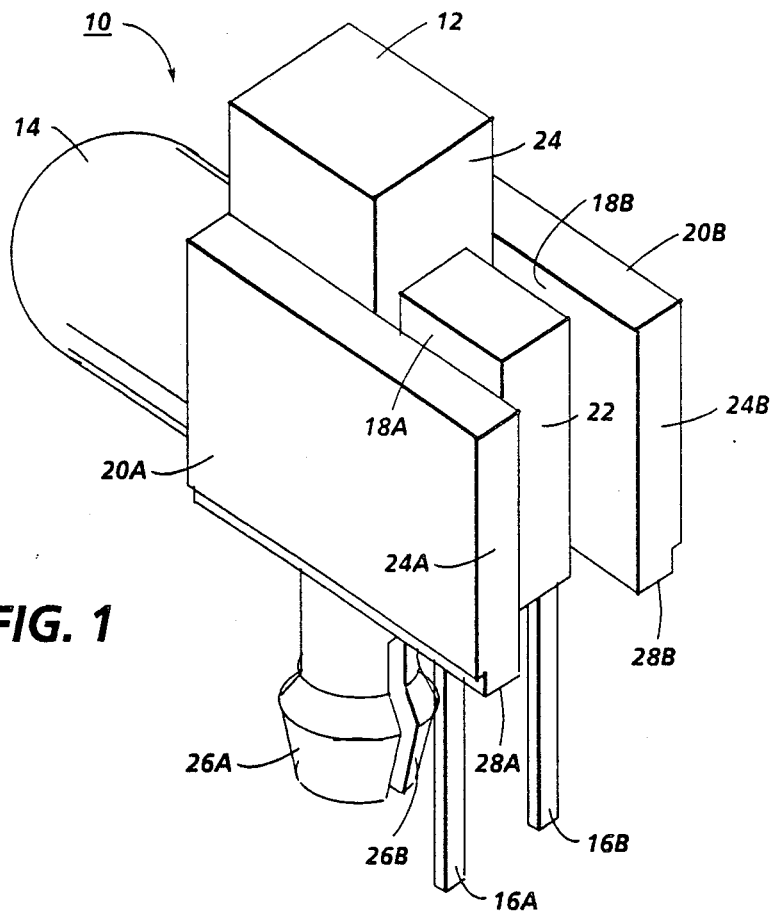
FIG. 1 is an isometric drawing of the LED assembly of the present invention.

FIG. 1 shows an isometric view of the light emitting diode assembly of the present invention. The assembly 10 comprises two separate parts. The first part, body 12, is the container and support for the LED 14. The body, or main housing, 12 could be, for example, a commercial material sold as PETRA 130 FR, or the equivalent. The body must be able to withstand robotic handling and also be able to withstand the high temperature of a wave soldering process. In the figures, the body 12 may appear to be separate pieces of body material, but, in actuality, body 12 is one homogeneous piece of plastic, or said equivalent material. The solid lines in the figures are to show for clarity the many edges of this part. Depending on the mode of manufacture of the body part 12, the edges could be, if desired, rounded very slight for ease of handling. The other part seen in FIG. 1 is the LED 14. LEDs are common in the industry, and thus no specific LED is called out. The two lead 16A and 16B of the LED 14 are seen to be extending down towards the bottom of the drawing. These leads are actually extending through two holes in the assembly body 12 and bent down towards the bottom of the assembly 10, as will be seen more clearly in conjunction with FIG. 2. The LED 14 would be inserted into a complementary hole formed in the front of the body section 12 with the leads extending through the holes also formed in the body 12. These holes and their position will be seen more clearly in conjunction with FIG. 2B. By means not shown, the leads are then bent in a direction down to the bottom of the assembly. After the LED is inserted in the body 12, manually or automatically by a prior art type robotic device, and the leads bent as shown and described, the LED 14 and body 12 become assembly 10. The LED cannot fall out of the body 12 at this point because the bent leads keep the LED in the fixed position in the body 12.

Formed in said main housing 12 are two slots 18A and 18B. These two slots are parallel to the side walls 20A and 20B of housing 12 and run the full height of the body 12 and about 40% or so into the body, from the back surface towards the front surface. The center section 22 that remains, with the grooves 18A and 18B formed in the body thereof, is shown slightly indented away from the rear surface 24A and 24B of side walls 20A and 20B. This is a matter of choice and design, however, as the rear surface of center section 22 could be in the same plane as rear surfaces 24A and 24B. However, the center section 22 is indented in this example to show that a saving of plastic material is possible to accomplish a light assembly.

Also seen in FIG. 1 is top section 24. This section, in the form of a solid rectangular prism, is included as the place that the robotic device would grasp the assembly 10 for use in inserting the assembly device into the holes in a printed wiring board automatically. Again, the side walls 20A and 20B, center section 22, and top section 24 might appear to be separate pieces, and indeed they could be, if glued together, but in this application, the body is one contiguous piece of plastic material and made by any of the known plastic device manufacturing techniques.

Extending down from the housing 12 are the split snap-in projections 26A and 26B. These projections would be capable of slight movement in a direction to and away from the side walls 20A and 20B. This deformation allows the assembly to be inserted in the printed wiring board in a hole, the dimensions of which would cause the projections to deform slightly toward each other, and then when they pass completely through a hole, to snap apart, thus creating a tight fit to fixedly mount the LED assembly to the printed wiring board.

Also extending down slightly further than center section 22 are the rails 28A and 28B on side walls 20A and 20B. These rails are provided to elevate the center section 22 from the surface of the printed wiring board. This feature allows the assembly to be solder waved and then cleaned by any of the known solvents and subsequently dried without leaving a thin film of solvent which could possibly affect the electrical leads 16A and 16B extending down and below the bottom surface of the assembly.

Figure 2A:
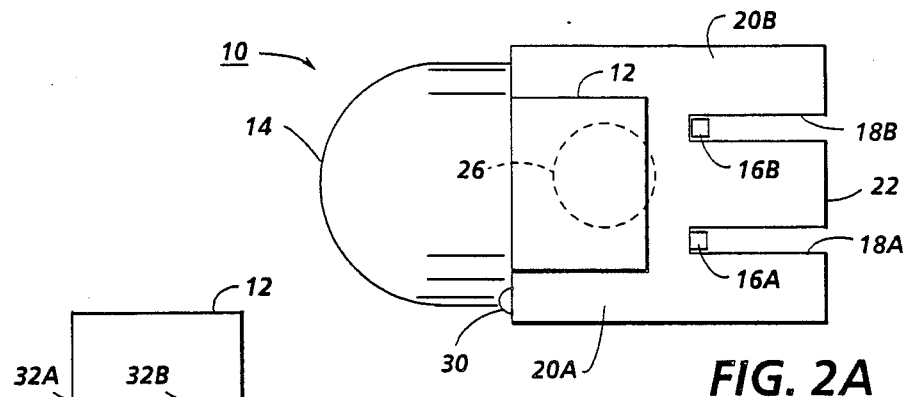
FIGS. 2A, 2B, 2C, and 2D are top, back, side, and front views, respectively, of the LED assembly of the present invention.
Figure 2B:
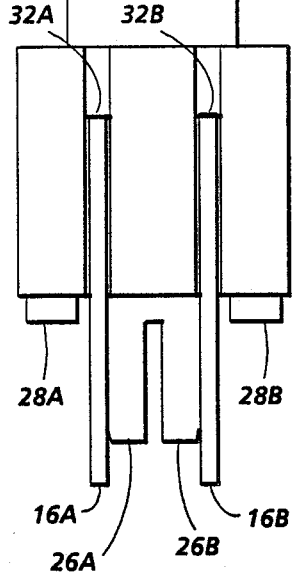

FIGS. 2A through 2D show the top, back, side and front, respectively, of the LED assembly 10. FIG. 2A clearly shows the LEd 14 mounted snugly in body 12 of the assembly. Grooves or wire slots 18A and 18B are shown to run vertically in the body 12 and parallel to the side walls 20A and 20B of the device. The rectangles 16A and 16B in FIG. 2A are the electrical leads of the LED extending through the body and already bent down towards the bottom of the assembly. FIG. 2B is a back or rear view of the assembly. Here the electrical leads are clearly shown to be extending out from holes 32A and 32B and bent in the downwards direction. Seen clearly, also, are the split snap-in projections 26A and 26B which are used for mounting the device to the board.

Figure 2C:
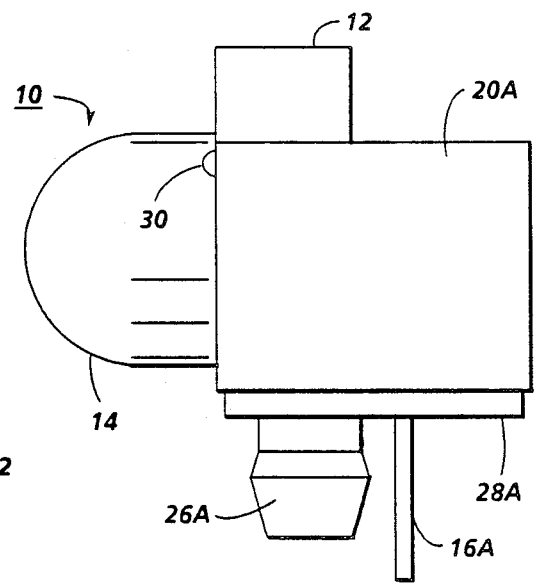
Figure 2D:
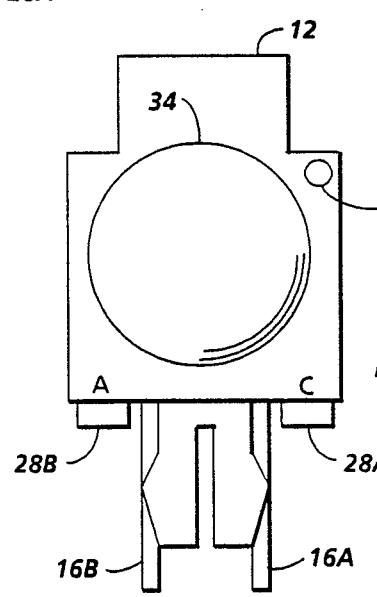

FIG. 2C shows the left side of the assembly 10. Seen here are the LED 14, top section 12, left sidewall 20A, left rail 28A, left electrical lead 16A and left projection 26A. FIG. 2D shows the front of the assembly, with the letters "A" and "C" formed in the plastic, if desired, to delineate the anode and cathode terminals of the LED as it is to be positioned in the assembly 10 in hole 34, now visible for the positioning of the LED 14 within the body 12. Seen in FIGS. 2A, 2C, and 2D is bump 30 which is utilized as a cathode indicator. That is, if a human technican cannot read the "A" or "C" markings on the front of the body 12, the bump can be used to indicate to the technician by sight or feel which side of the body 12 is the cathode side and then correctly position the LED within the body accordingly.

Figure 3:
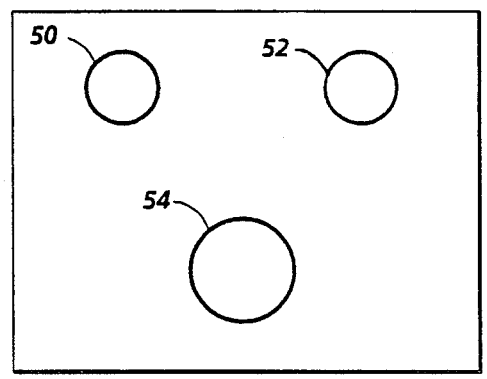
FIG. 3 is a schematic diagram of the hole pattern in the printed wiring board into which the LED assembly is installed.

FIG. 3 is an greatly enlarged diagram of the holes which must be drilled or formed in a printed wiring board to properly receive the LED assembly. Holes 50 and 52 would receive the electrical leads of the LED. For better operation of the device in the board, the holes 50 and 52 should be first plated through with solder. Thus, when the board with the LED assembly is passed through a solder wave process, the circuitry at the plated through holes can more definitely be electrically connected to the LED. Hole 54 would not be plated through as it is the hole through which the split snap-in projections pass upon installation.

Thus, a robotic, or other type automatic device, could be used to automatically insert the LED into the body 12 and cause the leads to be bent. Adjacent this apparatus, or cross country if the devices are shipped elsewhere, the entire LED assembly 10 could be again robotically handled and automatically inserted into a printed wiring board along with the other components that are used on that particular printed wiring board. This invention allows for quicker completion of a printed wiring board by allowing standard board stuffing robotic equipment insert the LED assembly 10 and completely bypass human intervention which is necessary for prior art LED assemblies. Putting the LED in the body 12 of the assembly allows the top of the assembly to have the top surface 24 to be grasped by the automatic insertion apparatus.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A right angle light emitting diode assembly comprising:
    light emitting diode means,
    insulating body means for receiving said diode means, said body means having generally parallel front and back surfaces, generally parallel top and bottom surfaces, and generally first and second parallel side surfaces, said front surface having a hole or cavity formed therein to receive part of said diode means, whereby some of said diode means protrudes beyond the front surface, said cavity having two holes at the rear of said hole or cavity through which are placed the leads of said diode means, said body means having two parallel slots formed therein, said slots being parallel to the sides of said body and extending from the top surface to the bottom surface and from the rear surface only part way towards said front surface, said slots being formed in said body means aligned with said holes formed at the rear of said hole or cavity such that the leads of said diode means can be bent down in said slots toward the bottom surface of said body,
    further including an addition to the top surface of said body means which could accommodate a robotic insertion apparatus, and
    further including split snap-in projection means extending downwardly from the bottom surface of said body means, said split snap-in projection means being capable of slight deformation to accommodate a hole in which the projection means are inserted into, wherein the projection means deform inwardly while in the hole and the ends thereof relax to the nominal position as the leading ends pass through and clear the ends of said hole.

2. The diode assembly as set forth in claim 1 wherein the side walls formed by the existence of said slots are longer than the center section thereof asuch that as the bottom surface of said assembly is placed on a flat surface said rails will cause said assembly to be elevated slightly, leaving a space between the center section and an adjacent surface.

3. The diode assembly as set forth in claim 2 further including a small protuberance in one or the other of the upper corners of said front surface to allow identification of said positional relationship of said assembly.

4. An article of manufacture comprising:

insulating body means having generally parallel front and back surfaces, generally parallel top and bottom surfaces, and generally first and second parallel side surfaces, said front surface having a hole or cavity formed therein, said cavity having two holes at the rear of said hole or cavity, said body means having two parallel slots formed therein, said slots being parallel to the sides of said body and extending from the top surface to the bottom surface and from the rear surface only part way towards said front surface, said slots being formed in said body means aligned with said holes formed at the rear of said hole or cavity, further including an addition to part of the top surface of said body means extending up from said top surface of said body means, further including split snap-in projection means extending downwardly from the bottom surface of said body means, said split snap-in projection means being capable of slight deformation in a direction to and from one another wherein the side walls formed by the existence of said slots are longer than the center section thereof such that said assembly will be elevated slightly if the bottom surface thereof is placed on a flat surface, and further including a small protuberance in one or the other of the upper corners of said front surface to allow identification of said positional relationship of said assembly.

* * * * *